(12) United States Patent
Takahashi

(10) Patent No.: US 12,028,630 B2
(45) Date of Patent: Jul. 2, 2024

(54) SIGNAL PROCESSING APPARATUS, PHOTOELECTRIC CONVERSION APPARATUS, IMAGE CAPTURING SYSTEM, AND CONTROL METHOD OF SIGNAL PROCESSING APPARATUS

(71) Applicant: CANON KABUSHIKI KAISHA, Tokyo (JP)

(72) Inventor: Keisuke Takahashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 55 days.

(21) Appl. No.: 17/711,087

(22) Filed: Apr. 1, 2022

(65) Prior Publication Data

US 2022/0337768 A1 Oct. 20, 2022

(30) Foreign Application Priority Data

Apr. 20, 2021 (JP) .................................. 2021-071117

(51) Int. Cl.
*H04N 25/63* (2023.01)
*G06T 5/50* (2006.01)
*G06T 7/90* (2017.01)
*H01L 27/146* (2006.01)
*H04N 23/84* (2023.01)
(Continued)

(52) U.S. Cl.
CPC ............. *H04N 25/63* (2023.01); *G06T 5/50* (2013.01); *G06T 7/90* (2017.01); *H01L 27/14634* (2013.01); *H04N 23/84* (2023.01); *H04N 25/77* (2023.01); *H04N 25/79* (2023.01); *G06T 2207/10024* (2013.01); *G06T 2207/20216* (2013.01)

(58) Field of Classification Search
None
See application file for complete search history.

(56) References Cited

U.S. PATENT DOCUMENTS

2006/0006426 A1* 1/2006 Inaba ..................... H04N 25/63
348/E5.081
2006/0044424 A1* 3/2006 Shirai .................. H04N 25/677
348/241
(Continued)

FOREIGN PATENT DOCUMENTS

JP 2006-157242 A 6/2006
JP 2006173220 A * 6/2006

OTHER PUBLICATIONS

English translation of JP-2006173220-A, Ishihara, Jun. 2006 (Year: 2006).*

*Primary Examiner* — James M Hannett
(74) *Attorney, Agent, or Firm* — Carter, DeLuca & Farrell LLP

(57) ABSTRACT

In the control method of the signal processing apparatus of the present embodiment, the portion at which a predetermined number of pixel values exceeding a first threshold value is continuous is specified as floating data of continuous image data indicated by pixel values output from a plurality of continuous light-shielded pixels. Reference data indicating a reference of a specific color is output, which is obtained by using a rest of image data, which is the continuous image data from which the floating data is removed, and alternative image data having pixel values not exceeding the first threshold value, which is used in place of the floating data.

18 Claims, 12 Drawing Sheets

(51) Int. Cl.
*H04N 25/77* (2023.01)
*H04N 25/79* (2023.01)

(56) References Cited

U.S. PATENT DOCUMENTS

| | | | |
|---|---|---|---|
| 2009/0278962 A1* | 11/2009 | Richardson | H04N 25/677 |
| | | | 348/241 |
| 2010/0231762 A1* | 9/2010 | Shirai | H04N 25/677 |
| | | | 348/E5.081 |
| 2011/0025874 A1* | 2/2011 | Tamaoki | H04N 25/63 |
| | | | 348/222.1 |

* cited by examiner

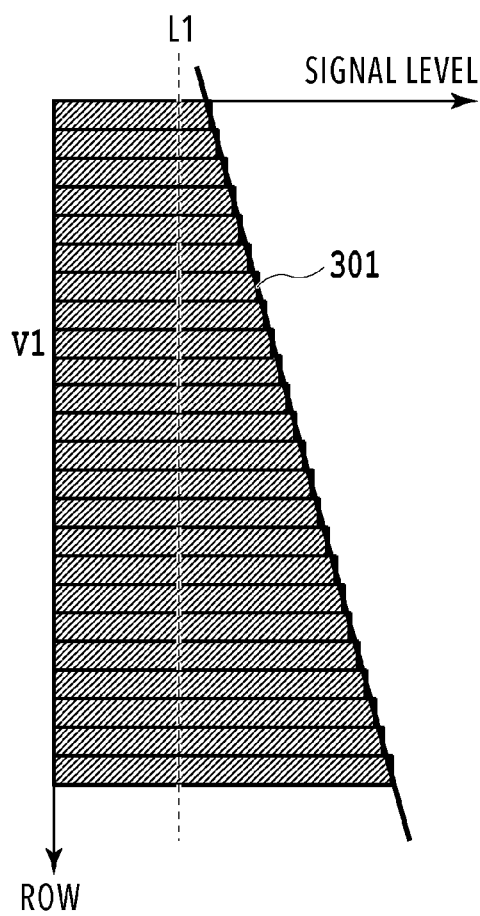 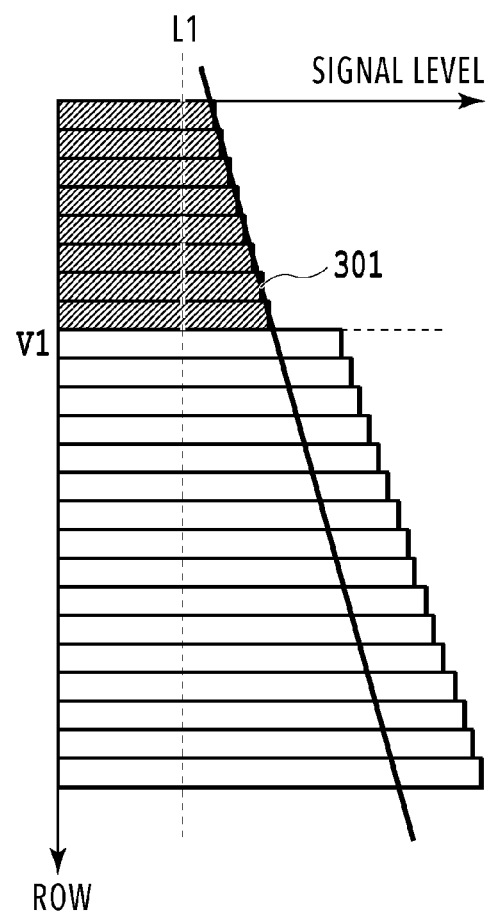
FIG.3A  FIG.3B

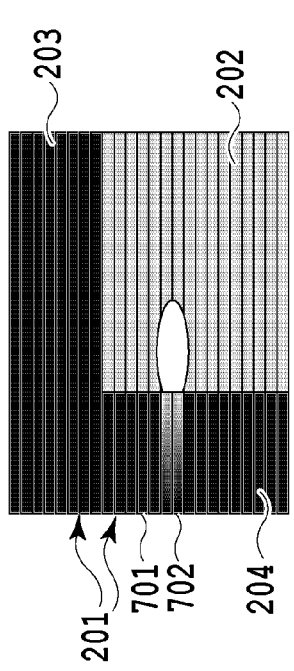

LIGHT-SHIELDING DATA P (1, i), P (2, i), ..., P (24, i) IN i ROW 701

| 50 | 800 | 60 | 400 | 250 | 10 | 35 | 300 | 25 | 65 | 400 | 80 | 20 | 15 | 300 | 150 | 10 | 40 | 120 | 90 | 20 | 60 | 105 | 110 |

OUTLIER PIXEL DETECTION IN A CASE WHERE SECOND THRESHOLD VALUE IS SET TO 100LSB

| × | × | | × | × | | | × | | | × | | | | × | × | | | × | | | | × | × |

OPERATION OF NUMBER OF PIECES OF OUTLIER DATA COUNTER N IN A CASE WHERE NUMBER OF COMPARISONS IS SET TO NINE

| 0 | 1 | 0 | 1 | 2 | 0 | 0 | 1 | 0 | 0 | 1 | 0 | 0 | 0 | 1 | 2 | 0 | 0 | 1 | 0 | 0 | 0 | 1 | 2 |

IT IS DETERMINED THAT OB FLOATING HAS NOT OCCURRED IN i ROW AND 0 IS SET TO OB FLOATING FLAG

FIG.7C

LIGHT-SHIELDING DATA P (1, j), P (2, j), ..., P (24, j) IN j ROW 702

| 50 | 800 | 60 | 400 | 250 | 10 | 35 | 300 | 25 | 65 | 400 | 80 | 20 | 15 | 105 | 110 | 115 | 120 | 125 | 130 | 135 | 140 | 145 | 150 |

OUTLIER PIXEL DETECTION IN A CASE WHERE SECOND THRESHOLD VALUE IS SET TO 100LSB

| × | × | | × | × | | | × | | | × | | | | × | × | × | × | × | × | × | × | × | × |

OPERATION OF NUMBER OF PIECES OF OUTLIER DATA COUNTER N IN A CASE WHERE NUMBER OF COMPARISONS IS SET TO NINE

| 0 | 1 | 0 | 1 | 2 | 0 | 0 | 1 | 0 | 0 | 1 | 0 | 0 | 0 | 1 | 2 | 3 | 4 | 5 | 6 | 7 | 8 | 9 | 10 |

OB FLOATING HAS OCCURRED IN j ROW AND 1 IS SET TO OB FLOATING FLAG

SIGNAL PROCESSING APPARATUS, PHOTOELECTRIC CONVERSION APPARATUS, IMAGE CAPTURING SYSTEM, AND CONTROL METHOD OF SIGNAL PROCESSING APPARATUS

BACKGROUND

Field

The present disclosure relates to a signal processing apparatus, a photoelectric conversion apparatus, an image capturing system, and a control method of a signal processing apparatus.

Description of the Related Art

A photoelectric conversion apparatus having light-receiving pixels arranged in a light-receiving area that receives light from an object and light-shielded pixels arranged in a light-shielding area that is shielded by a light-shielding film, such as metal, is known. There is a case where the light-shielded pixel is used for detecting a black level of image data that is output from the light-receiving pixel and the light-shielding area is also called an optical black (OB) area. Here, although the output of the light-shielded pixel does not change normally, there is a case where a gradual change called "OB floating" occurs in the output of the light-shielded pixel as a result of light entering the inside of the OB area. Japanese Patent Laid-Open No. 2006-157242 has disclosed a method of determining that OB floating has occurred in a case where the output of the light-shielded pixel is larger than a threshold value that is set in advance and not using the image data of the row in which OB floating has occurred for generation of an OB level correction value.

SUMMARY

In the row for which OB floating is determined, there is a case where the output of the light-shielding data reaches the peak at the pixel the closest to a target object and the output gradually drops down to the normal OB level as the distance from the target object increases. In a case where the threshold value for determining OB floating is increased, overcorrection occurs and on the other hand, in a case where the threshold value for determining OB floating is reduced, normal data is determined to be OB floating data. Because of this, it is not possible to output reference data of an appropriate specific color, such as an OB level.

The signal processing apparatus according to one aspect of the present disclosure is a signal processing apparatus that processes image data from a solid-state image sensing element having a plurality of light-receiving pixels arranged in a light-receiving area and a plurality of light-shielded pixels arranged in a light-shielding area and includes: a first determination unit configured to specify a portion at which a predetermined number of pixel values exceeding a first threshold value is continuous as floating data of continuous image data indicated by pixel values output from a plurality of continuous light-shielded pixels; and an output unit configured to output reference data indicating a reference of a specific color obtained by using a rest of image data, which is the continuous image data from which the floating data specified by the first determination unit is removed, and alternative image data having pixel values not exceeding the first threshold value, which is used in place of the floating data specified by the first determination unit.

Further features of the present disclosure will become apparent from the following description of exemplary embodiments with reference to the attached drawings.

BRIEF DESCRIPTION OF THE DRAWINGS

FIG. 3A and FIG. 3B are each a diagram showing an example of image data before OB clamp processing;

FIG. 7A to FIG. 7C are diagrams explaining processing that is performed by the second determination unit;

DESCRIPTION OF THE EMBODIMENTS

In the following, embodiments of the present disclosure are explained with reference to the drawings. The following embodiments are not intended to limit the present disclosure according to the claims and all combinations of features explained in the present embodiments are not necessarily indispensable to the solution of the present disclosure. The same reference number is attached to the same component and its explanation is omitted.

First Embodiment

Figure 1:
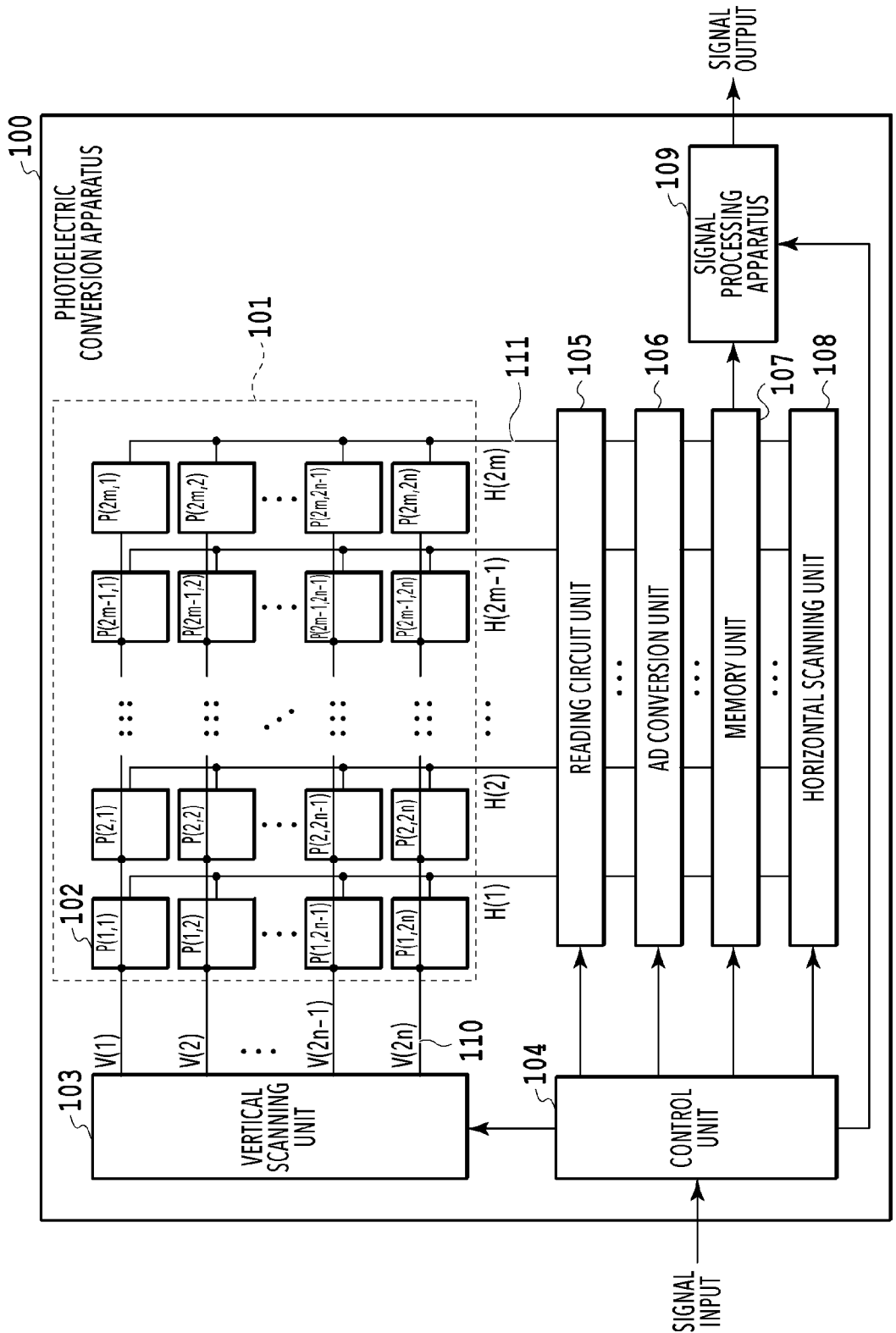
FIG. 1 is a diagram showing a configuration example of a photoelectric conversion apparatus comprising a signal processing apparatus.

A signal processing apparatus according to the present embodiment is explained by using a diagram. FIG. 1 is a diagrams showing a configuration example of a photoelectric conversion apparatus comprising a signal processing apparatus according to the present embodiment. As shown in FIG. 1, a photoelectric conversion apparatus 100 has a photoelectric conversion unit 101, a vertical scanning unit 103, a control unit 104, a reading circuit unit 105, an AD conversion unit 106, a memory unit 107, and a horizontal scanning unit 108. The photoelectric conversion unit 101 has a plurality of pixels 102 arranged in a plurality of rows and in a plurality of columns. The photoelectric conversion unit 101 has a light-receiving area and a light-shielding area. The light-receiving area is an area in which a plurality of pixels receiving light from an object is arranged. The light-shielding area is an area that is shielded from light by a light-shielding film, such as metal, around the light-receiving area and in which a plurality of pixels used for detecting a black level is arranged. The photoelectric conversion unit 101 outputs image data that is processed by a signal processing apparatus 109. In the present embodiment, although an example is shown in which the signal processing apparatus 109 is mounted in the photoelectric conversion apparatus 100, the example is not limited to this. The signal processing apparatus 109 may be arranged separately from, for example, the photoelectric conversion apparatus 100 and the photoelectric conversion unit 101.

The photoelectric conversion unit 101 has the 2 m×2n pixels 102 arranged so that 2 m in the row direction and 2n in the column direction, respectively. The vertical scanning unit 103 is connected to the 2 m pixels 102 arranged in the row by a row selection line 110 (V(2n)) and selects a row from which a signal is read. In the selected row, via a vertical output line 111 (H(2 m)), signals output from the 2 m pixels 102 included in the selected row are read to the reading circuit unit 105 at the same time. The reading circuit unit 105 includes an amplifier and the like and may amplify the signal output from the pixel 102. The signal output from the reading circuit unit 105 is converted from the analog signal into a digital signal (AD conversion) in the AD conversion unit 106 and stored temporarily in the memory unit 107. After that, the digital signal whose address is designated by the horizontal scanning unit 108 is read sequentially to the signal processing apparatus 109 and digital signal processing is performed in the signal processing apparatus 109. The control unit 104 obtains setting information, such as an image capturing condition at the time of image capturing of the photoelectric conversion apparatus 100, from a signal input from the outside and supplies a control signal in accordance with the condition to each component included in the photoelectric conversion apparatus 100. The control unit 104 performs control for the vertical scanning unit 103, the reading circuit unit 105, the AD conversion unit 106, the memory unit 107, the horizontal scanning unit 108, and the signal processing apparatus 109.

In the signal processing apparatus 109, processing to reduce reset noise that occurs in a switch element (for example, MOS transistor) included in each of the pixels 102 of the photoelectric conversion unit 101 is performed. Further, there is a case where the image data that is output from the photoelectric conversion unit 101 includes a dark current that occurs from a photodiode included in the pixel 102 and a variation (FPN: fixed pattern noise) that occurs resulting from a difference in the circuit, such as power source impedance and signal delay. In the present embodiment, the state where the FPN changes with a certain rule for each row and for each column is referred to as shading. The signal processing apparatus 109 generates correction data including the FPN component and the shading component by averaging light-shielding data for each row and for each column after reducing the reset noise component. Next, the signal processing apparatus 109 performs processing to reduce the FPN component and the shading component of the image data by using the correction data generated from the light-shielding data. In the present embodiment, the processing to reduce the FPN component and the shading component of the image data by using the light-shielding data, which is performed by the signal processing apparatus 109, is referred to as OB clamp processing. Here, it is possible to set an arbitrary area within a light-shielding area 201 as the area for which the average value of the light-shielding data is obtained for each row and for each column. This area is referred to as a clamp value generation area. Further, the correction data obtained by averaging the light-shielding data is referred to as a clamp value. That is, it can be said that the above-described signal processing apparatus 109 is an apparatus that processes image data from a solid-state image sensing element having a plurality of light-receiving pixels arranged in the light-receiving area and a plurality of light-shielded pixels arranged in the light-shielding area. The signal processing apparatus 109 may be a computer, such as a personal computer including a processor (for example, CPU and MPU), separate from the photoelectric conversion apparatus 100. Further, the signal processing apparatus 109 may be, for example, a circuit, such as an ASIC, which implements functions, to be described later.

<Image Data Output from Photoelectric Conversion Unit>

Figure 2:
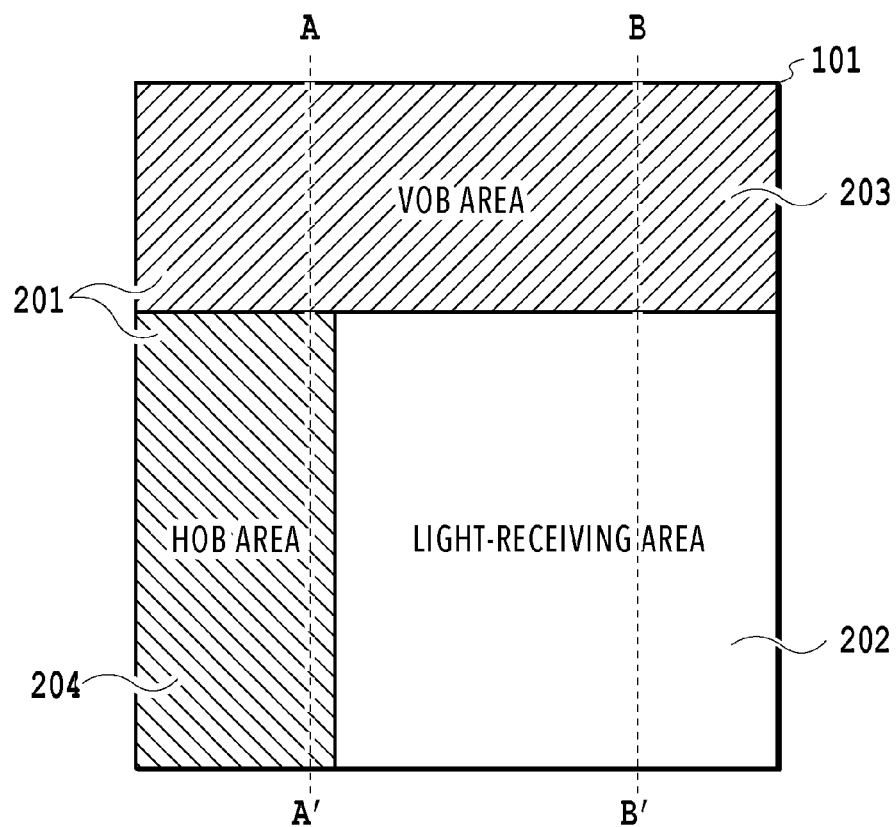
FIG. 2 is a conceptual diagram of image data that is output from a photoelectric conversion unit of the photoelectric conversion apparatus.

Image data that is output from the photoelectric conversion unit is explained by using a diagram. FIG. 2 is a conceptual diagram in a case where image data that is output from the photoelectric conversion unit 101 is arranged in accordance with the pixel arrangement of the photoelectric conversion unit 101. The photoelectric conversion unit 101 includes a light-receiving area 202 that receives light that passes through an optical system, such as a lens, and enters and the light-shielding area 201 that optically shields incident light by a light-shielding film, such as metal. The light-shielding area 201 is a so-called reference area for determining a black level reference in image data that is obtained in the photoelectric conversion unit 101. Here, of the light-shielding area 201, the area that optically shields the pixel 102 across all the columns on the upper side of the screen as shown in FIG. 2 is referred to as a VOB area 203. Further, the area that is located on the left side of the light-receiving area 202 and which optically shields the pixel 102 across all the rows is referred to as a HOB area 204.

<Image Data Before and After OB Clamp Processing>

First, image data before OB clamp processing is explained by using diagrams. FIG. 3A and FIG. 3B are each a diagram showing an example of image data before OB clamp processing and FIG. 3A shows an example of a signal level corresponding to the shading component in each row between A and A' in FIG. 2 and FIG. 3B shows an example of a signal level corresponding to the shading component in each row between B and B' in FIG. 2. In FIG. 3A and FIG. 3B, the vertical axis represents the row number and the horizontal axis represents the signal level. The signal level is represented by a pixel value and the pixel value is 0 at the origin and the pixel value becomes higher toward the right side and in a case where the image data is represented by eight bits, the pixel value is 256 at maximum. This explanation of the signal level is the same in FIG. 4A and FIG. 4B, to be described later.

FIG. 3A shows a conceptual diagram in which the FPN component uniform for each row increases and shows a clamp value 301 in a case where the entire area of the light-shielding area 201 is taken to be the clamp value generation area. A signal level L1 indicates a reference value of a black level. The difference between the clamp value 301 and the signal level L1 is the shading component that should be reduced by OB clamp processing. In FIG. 3B, after a row V1 (area shown schematically in white on the lower side including the row V1), the light-receiving area is arranged and the state where the signal level is raised by the amount corresponding to the light-receiving data is shown.

Figure 4A:
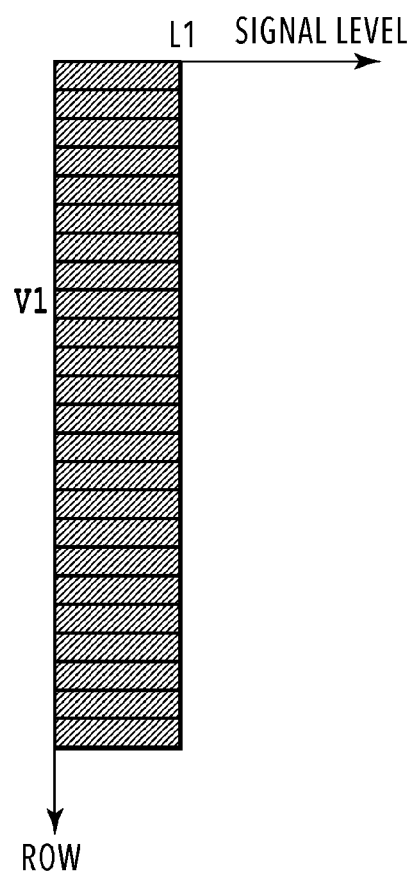
FIG. 4A and FIG. 4B are each a diagram showing an example of image data after OB clamp processing.
Figure 4B:
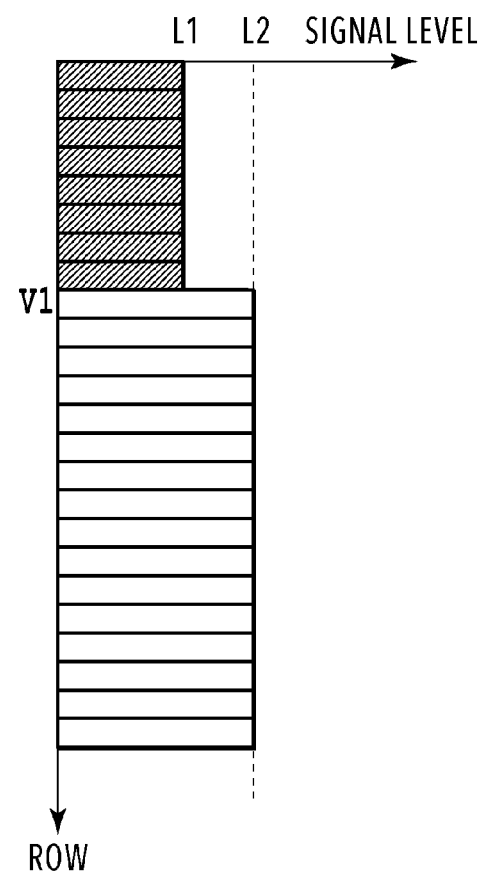

Following the above, image data after OB clamp processing is explained by using diagrams. FIG. 4A and FIG. 4B are each a diagram showing an example of image data after OB clamp processing. FIG. 4A shows an example of results (image data) of subtracting the clamp value 301 (shading component) from the signal level of each row between A and A' in FIG. 2. FIG. 4B shows an example of results (image data) of subtracting the clamp value 301 (shading component) from the signal level of each row between B and B' in FIG. 2. In FIG. 4A and FIG. 4B, the vertical axis represents the row number and the horizontal axis represents the signal level. L2 indicates light-receiving data after the shading component is reduced.

In FIG. 4A and FIG. 4B, the state is shown where the shading component has been removed from the image data obtained by the photoelectric conversion unit 101, including the light-receiving area 202, by performing the subtraction of the clamp value 301. That is, an example is shown in which the OB clamp processing by the signal processing apparatus 109 has been performed appropriately.

Here, it is considered that the clamp value 301 is obtained by, for example, performing integral averaging of the light-shielding data for each row. Note that in a case where the value obtained by performing the integral averaging of the light-shielding data for each row is used for subtraction as it is in the OB clamp processing, there is a possibility that the integral average value varies due to the influence of random noise or the like, which is different for each pixel. Because of this, it is no longer possible to reduce the FPN component and the shading component appropriately in the OB clamp processing and there is a possibility that the accuracy of the OB clamp processing is reduced. Consequently, it is considered that, for example, by using a filter shown below for the light-shielding data, the clamp value is caused to have resistance to the variation in row and the accuracy of the OB clamp processing is improved. As the filter, mention is made of, for example, an IIR LPF (Infinite Impulse Resonance Low Pass Filter) and the like.

Further, there is a possibility that the light-shielding data includes image data whose value of the pixel value is singularly large or small (hereinafter, referred to as "defective data") due to a defect that occurs in the manufacturing process. In a case where defective data is mixed in the generation process of the clamp value, the clamp value shifts from the ideal value, and therefore, the accuracy of the OB clamp processing is reduced. Consequently, a method is considered in which a predetermined threshold value is set in advance and in a case where the difference between this threshold value and the light-shielding data is large, for example, the clamp value obtained from the previous row is input in place of the light-shielding data. By doing so, it is possible to complement the defective data whose difference from the desired FPN component is large by the clamp value obtained from the previous row, and therefore, it is made possible to improve the accuracy of the OB clamp processing.

<Configuration of Clamp Value Generation Unit>

Figure 5:
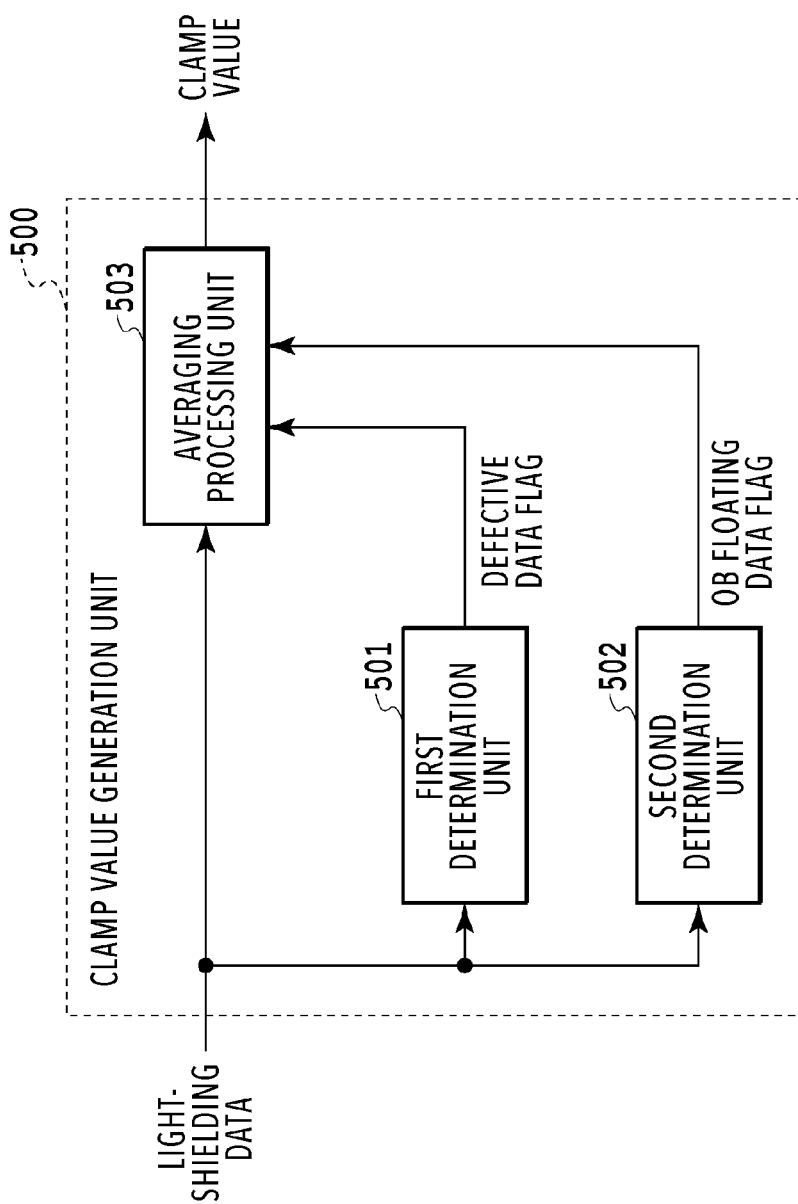
FIG. 5 is a block diagram showing a configuration example of a clamp value generation unit.

The configuration of the clamp value generation unit of the signal processing apparatus 109 is explained by using a diagram. FIG. 5 is a block diagram showing a configuration example of a clamp value generation unit 500 of the signal processing apparatus 109. In the present embodiment, a signal processing apparatus capable of preventing black sink due to OB floating and reducing the shading component appropriately is described.

As shown in FIG. 5, the clamp value generation unit 500 has a first determination unit 501, a second determination unit 502, and an averaging processing unit 503. To the clamp value generation unit 500, light-shielding data is input. The clamp value generation unit 500 performs OB clamp processing for the input light-shielding data and outputs a clamp value generated by this processing.

The averaging processing unit 503 obtains an average value by filter processing after performing complementation of defective data for the input light-shielding data and stores the obtained average value as a clamp value. The complementation of defective data for the input light-shielding data is performed in accordance with determination results by the first determination unit 501 and determination results by the second determination unit 502, to be described later in detail. For the filter processing in the averaging processing unit 503, although it is desirable to use the IIR LPF described previously from the standpoint of the reduction in the variation in row, integral averaging may be used and this is not limited as long as it is possible to obtain an average value of light-shielding data as a clamp value.

The first determination unit 501 determines whether or not the input light-shielding data is defective data. The first determination unit 501 compares, for example, a predetermined first threshold value that is set in advance and the pixel value of the light-shielding data and determines whether or not the input data is defective data in accordance with the comparison results. Then, the first determination unit 501 outputs a defective data flag indicating whether or not the input data is defective data to the averaging processing unit 503 in accordance with the determination results. In a case where the comparison results that the pixel value of the light-shielding data is larger than the first threshold value are obtained, the first determination unit 501 outputs a defective data flag "1" indicating that the input data is defective data to the averaging processing unit 503. On the other hand, in a case where the comparison results that the pixel value of the light-shielding data is less than or equal to the first threshold value are obtained, the first determination unit 501 outputs a defective data flag "0" indicating that the input data is not defective data to the averaging processing unit 503. The first threshold value is determined based on the signal level of a defective pixel that occurs in the photoelectric conversion unit 101. The signal level of the defective pixel is, for example, about five times the reference value of the black level, and therefore, the first threshold value may be, for example, a numerical value five times the signal level L1. Further, it may also be possible to set, for example, the maximum value of the data that is processed by the signal processing apparatus 109 as the upper limit value of the first threshold value. In a case where the signal processing apparatus 109 processes 14-bit data, it may also be possible to set the upper limit value of the first threshold value to, for example, 16,383. It can be said that the first threshold value is data for identifying defective data that occurs randomly among a plurality of pieces of image data. In a case of receiving the detective data flag "1" from the first determination unit 501, the averaging processing unit 503 uses the clamp value stored in the averaging processing unit 503 or the first threshold value used for the determination of the first determination unit 501 for the filter processing. That is, it can be said that the first determination unit 501 specifies the image data having the pixel value exceeding the first threshold value among the continuous image data as defective data.

The second determination unit 502 determines whether or not the input light-shielding data is OB floating data. For example, the second determination unit 502 counts the number of pieces of outlier data whose pixel value of the light-shielding data is determined to be larger than a predetermined second threshold value set in advance and compares a number of pieces of outlier data counter and a number of comparisons. Then, the second determination unit 502 determines whether or not the light-shielding data is OB floating data in accordance with the comparison results. Note that the number of pieces of outlier data counter is reset in a case where the position of the light-shielding data is not continuous or in a case where the light-shielding data larger than the second threshold value is not continuous. Then, the first determination unit 501 outputs an OB floating data flag indicating whether or not the input data is OB floating data to the averaging processing unit 503 in accordance with the determination results. In a case where the comparison results that the number of pieces of outlier data counter is larger than the number of comparisons are obtained, the second determination unit 502 outputs the OB floating data flag "1" indicating that the input data is OB floating data to the averaging processing unit 503. On the other hand, in a case where the comparison results that the number of pieces of outlier data counter is less than or equal to the number of comparisons are obtained, the second determination unit 502 outputs the OB floating data flag "0" indicating that the input data is not OB floating data to the averaging processing unit 503. The second threshold value is a threshold value for identifying floating data whose pixel value of the specific color gradually changes and determined based on the signal level of the defective pixel that occurs in the photoelectric conversion unit 101. The specific color is, for example, black or white. The second threshold value is a threshold value for identifying floating data whose pixel value of the specific color gradually changes and determined based on the reference value of the black level. The specific color is, for example, black or white. The second threshold value may be, for example, a numerical value equivalent to the signal level L1. Further, for example, it may also be possible to set the maximum value of the data that is processed by the signal processing apparatus 109 as the upper limit value of the second threshold value. In a case where the signal processing apparatus 109 processes 14-bit data, it may also be possible to set the upper limit value of the second threshold value to, for example, 16,383. In a case of receiving the OB floating data flag "1" from the second determination unit 502, the averaging processing unit 503 performs the filter processing by using the following data. That is, the averaging processing unit 503 outputs reference data indicating the reference of the specific color obtained based on the rest of the image data, which is the continuous image data from which the floating data specified by the second determination unit 502 is removed, and the alternative image data. The alternative image data is data having the pixel value not exceeding the second threshold value, which is used instead of the floating data specified by the second determination unit 502. As the alternative image data, for example, image data having the clamp value stored in advance in the averaging processing unit 503, the clamp value output from the previous target in the averaging processing unit 503, or the second threshold value used for the determination of the second determination unit 502 is used. It can be said that the averaging processing unit 503 does not use the light-shielding data that corresponds to the OB floating data flag and which is input to the clamp value generation unit 500. The light-shielding data that corresponds to the defective data flag and which is input to the clamp value generation unit 500 is not used.

<Determination Processing of OB Floating Data>

Figure 6:
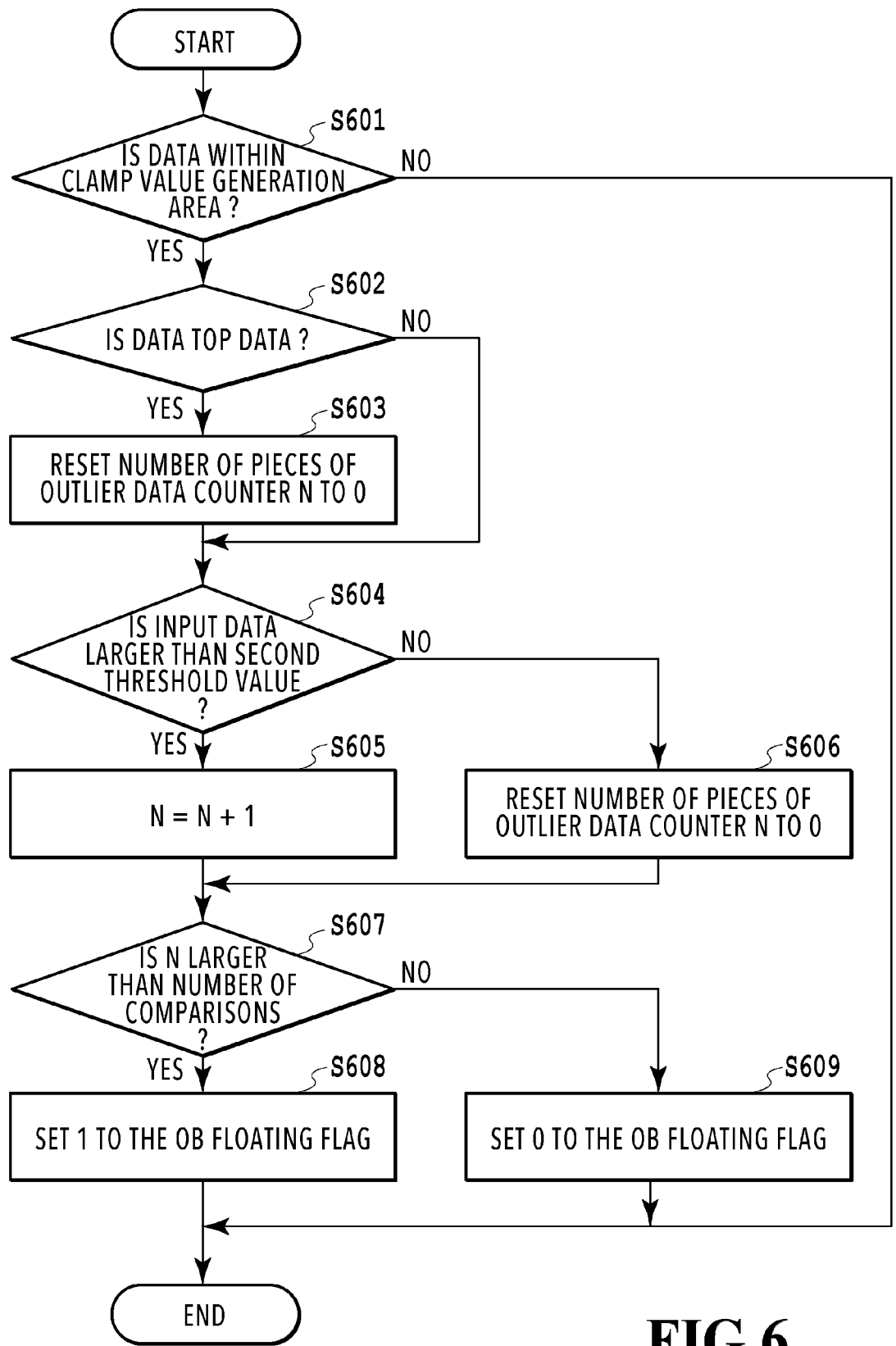
FIG. 6 is a flowchart showing a flow of processing that is performed by a second determination unit.

The determination processing of OB floating data, which is performed by the second determination unit 502, is explained by using a diagram. FIG. 6 is a flowchart showing a flow of the determination processing of OB floating data, which is performed by the second determination unit 502. In the following, step is described as "S". At the time of determining OB floating, data is taken in sequentially to the second determination unit 502 from the data group that is output from the photoelectric conversion unit 101. Then, for each piece of data, the processing in accordance with FIG. 6 is performed. The determination of whether or not OB floating has occurred is performed in accordance with S601 to S609 shown in FIG. 6. In the present embodiment, the determination of whether or not OB floating has occurred in the target row or pixel is performed.

First, at S601, whether or not the target data is data within the clamp value generation area (the light-shielding area 201 in FIG. 2) is determined. For this determination, the pixel (position information) included in the target data or the pixel (position information) that is sent from the control unit 104 and which corresponds to the target data is used. In a case where the determination results indicate that the target data is data within the clamp value generation area (YES at S601), the processing is moved to S602. On the other hand, in a case where the target data is data within the light-receiving area 202 and not data within the clamp value generation area (NO at S601), the flow shown in FIG. 6 is terminated.

At S602, whether or not the target data is top data is determined. Here, the top data is, for example, data that is represented by light-shielding data P (1, y) and which is processed first in each row within the clamp value generation area. In a case where the determination results indicate that the target data is top data (YES at S602), the processing is moved to S603. On the other hand, in a case where the target data is not top data (NO at S602), the processing is moved to S604.

At S603, processing to reset the current number of pieces of outlier data counter N to "0" (N=0) is performed.

At S604, the signal level of the target data and the second threshold value are compared. The second threshold value is the sum of the signal level L1 and the random variation component depending on the manufacturing process and may be set to, for example, 100 LSB. In the present embodiment, light-shielding data whose difference from the second threshold value is large is referred to as "outlier data". Here, the second threshold value is a threshold value for determining outlier data and controlled independently of the first threshold value described previously. In a case where the comparison results indicate that the signal level (input data) of the target data is larger than the second threshold value (YES at S604), the processing is moved to S605. In a case where the signal level (input data) of the target data is less than or equal to the second threshold value (NO at S604), the processing is moved to S606.

At S605, processing to add 1 to the current number of pieces of outlier data counter N and set (update) the number of pieces of outlier data counter N to "N+1" is performed.

At S606, processing to reset the current number of pieces of outlier data counter N to "0" (N=0) is performed. As in the processing at S603 and S606, by resetting the number of pieces of outlier data counter N in a case where the target data is not outlier data, it is made possible to count the number of pieces of continuous outlier data. The number of pieces of outlier data counter N counts the number of pieces of continuous outlier data, and therefore, it can also be said that the number of pieces of outlier data counter N is a continuous number of pieces of data counter.

At S607, the value of the number of pieces of outlier data counter N and the number of comparisons that is set in advance are compared. Here, the number of comparisons is a threshold value indicating how many times the number of pieces of outlier data counter N is continuous to determine OB floating and is a threshold value determined based on the identity of a defective pixel that occurs in the photoelectric conversion unit 101 and for example, it may also be possible to set the number of comparisons to five or more, or ten or less. In a case where the comparison results indicate that the value of the number of pieces of outlier data counter N is larger than the number of comparisons (YES at S607), the processing is moved to S608. On the other hand, in a case where the comparison results indicate that the value of the number of pieces of outlier data counter N is less than or equal to the number of comparisons (NO at S607), the processing is moved to S609.

At S608, it is determined that OB floating has occurred and processing to set "1" to the OB floating flag is performed. After the processing at S608, the flow shown in FIG. 6 is terminated.

At S609, it is determined that OB floating has not occurred and processing to set "0" to the OB floating flag is performed. After the processing at S609, the flow shown in FIG. 6 is terminated.

In a case where it is determined that OB floating has occurred in the target row based on the determination results by the flowchart shown in FIG. 6 (in a case where the OB floating flag is "1"), the clamp value obtained, for example, in the previous row, which is already stored in the averaging processing unit 503, is taken as the output of the clamp value generation unit 500. That is, in the row for which the occurrence of OB floating has been determined, the average value obtained from the data of the target row is not used for the generation of the clamp value. By doing so, it is made possible to prevent black sink resulting from OB floating by the OB clamp processing. Further, in the above-described flow, whether or not a predetermined number of pieces of image data whose pixel value exceeds the second threshold value is continuous is determined.

Further, in the above-described flow, the second determination unit 502 specifies the portion at which a predetermined number of pixel values exceeding the second threshold is continuous as floating data of the continuous image data indicated by the pixel values output from a plurality of continuous light-shielded pixels. Furthermore, it may also be possible to perform the above-described flow for each horizontal line output from a plurality of light-shielded pixels or for each vertical line.

Here, an example of data processing by the determination processing of OB floating data described above is explained by using diagrams. FIG. 7A to FIG. 7C are diagrams explaining a processing example of light-shielding data. FIG. 7A shows a concept of an output signal of the photoelectric conversion unit at the time of occurrence of OB floating at the boundary portion between the HOB area and the opening area. FIG. 7B shows an example of processing by the second determination unit 502 in an i row 701 in which OB floating has not occurred. FIG. 7C shows an example of processing by the second determination unit 502 in a j row 702 in which OB floating has occurred. FIG. 7B and FIG. 7C each show an example of light-shielding data in the light-shielding area and in a case where the second threshold value is set to 100 LSB and the number of comparisons is set to nine.

As shown in FIG. 7A, by intense light hitting the opening area adjacent to the HOB area 204, the state is brought about where the light-shielding data located on the right side of the HOB area 204 floats. As shown in FIG. 7B, in the i row 701 in which OB floating has not occurred, in a case where the second threshold value is set to 100 LSB in light-shielding data P (1, i), P (2, i), . . . , P (24, i), it is checked that the maximum value of the number of pieces of outlier data counter N is two. In a case where the number of comparisons is set to nine, it is determined that OB floating has not occurred in the i row and it is checked that "0" is set to the OB floating flag. As described above, in FIG. 7B, the light-shielding data exceeding the second threshold value is not continuous across ten or more pixels, and therefore, to the OB floating flag, "0" is set. In a case of checking that the OB floating flag is "0", the averaging processing unit 503 updates the clamp value based on the light-shielding data of the i row.

On the other hand, as shown in FIG. 7C, in the j row 702 in which OB floating has occurred, in a case where the second threshold value is set to 100 LSB in light-shielding data P (1, j), P (2, j), P (24, j), it is checked that the maximum value of the number of pieces of outlier data counter N is ten. In a case where the number of comparisons is set to nine, in the j row, it is determined that OB floating has occurred and it is checked that "1" is set to the OB floating flag. As described above, in FIG. 7C, the light-shielding data exceeding the second threshold value is continuous across ten or more pixels, and therefore, to the OB floating flag, "1" is set. In a case of checking that the OB floating flag is "1", the averaging processing unit 503 uses, for example, the clamp value obtained in a (j−1) row, which is the previous row, as the clamp value that is applied to the j row.

As an application example of the present embodiment, it is considered that the second threshold value is set to a value smaller than the first threshold value. For example, the second threshold value is set to a value about ⅕ of the first threshold value. By counting the number of pieces of continuous outlier data, even in a case where the second threshold value is made small, it is unlikely that the random variation of the light-shielding data is erroneously detected as outlier data and it is made possible to detect only OB floating. Consequently, even in a case where OB floating that changes gradually has occurred, it is made possible to prevent black sink by OB clamp processing and preferred OB clamp processing is enabled.

In the above-described embodiment, in a case where it is determined that OB floating has occurred in the target row, black sink is prevented by complementing the clamp value that is used for OB clamp processing for each target row by the already stored clamp value. Because of this, for example, even in a case where OB floating data occurs only in a partial area of the VOB area 203 and light-shielding data of almost all the target rows is normal, updating of the clamp value of the target row is cancelled. In the case such as this, the average modulus that is used for generation of a clamp value is reduced and there is a possibility that the accuracy of OB clamp processing is reduced. Consequently, in a case where it is determined that OB floating has occurred in the target data, it may be possible for the averaging processing unit 503 to use the clamp value stored in the averaging processing unit 503 for filter processing in place of the input light-shielding data. That is, it may also be possible for the averaging processing unit 503 to obtain an average value by filter processing and store the obtained average value as a clamp value after complementing the data for which it is determined that OB floating has occurred by the clamp value stored in the averaging processing unit 503. Here, although the example is shown in which the clamp value stored in the averaging processing unit 503 is used for complementation, the example is not limited to this. For example, any data indicating the level of the normal light-shielding data, such as the second threshold value that is used for determination of outlier data, may be used.

By doing so, in a case where it is determined that OB floating has occurred, it is made possible to complement input data for obtaining a clamp value for each single piece of data rather than complementing the clamp value that is used for OB clamp processing for each target row by the already stored clamp value. Consequently, it is possible to prevent black sink resulting from OB floating by OB clamp processing and further increase the average modulus, and therefore it is made possible to appropriately reduce the shading component and preferred OB clamp processing is enabled. Due to this, it is possible to suppress deterioration of image quality at the time of occurrence of OB floating.

Further, in the present embodiment, although the fixed value that is set in advance is used as the first threshold value and the second threshold value, for example, it may also be possible to set a value obtained by adding a fixed value that is set in advance to the clamp value obtained in the previous row as a threshold value in place of the fixed value. By doing so, it is made possible to use a relative value from the clamp value obtained in the previous row as a threshold value.

Further, in the present embodiment, although the example that uses the counter is explained as the detection method of continuous outlier data, for example, it may also be possible to use the Schmitt trigger in place of the counter and as long as it is possible to detect continuous outlier data, the example is not limited to that.

Second Embodiment

A signal processing apparatus according to the present embodiment is explained with reference to a diagram.

In recent years, a technique of increasing the number of vertical output lines in order to further increase the pixel data reading speed has been attracting attention. This is a technique of increasing the number of pieces of data that is read at a time and reducing the number of times of reading for each frame by increasing the number of vertical output lines. In a case where this technique of increasing the number of vertical output lines is used, the signal path of image data is different for each vertical output line, and therefore, there is a possibility of having the FPN component different for each vertical output line. Further, a case is also considered where a plurality of signal processing apparatuses is arranged, for example, for each color by taking the wiring property into consideration. In this case also, the signal path of image data is different for each color, and therefore, there is a possibility of having the FPN component different for each color. In the present embodiment, the minimum unit in which the FPN component is different resulting from the data path is referred to as "channel". On the other hand, the signal level that floats in the white direction due to OB floating is constant irrespective of the channel. Because of this, in a case where the difference in the FPN component for each channel is large, the signal level that should be determined to be OB floating varies for each channel.

In the present embodiment, a signal processing apparatus capable of generating a more appropriate clamp value by taking into consideration also a case where the FPN component for each channel is large as well as the occurrence of OB floating is explained.

Figure 8:
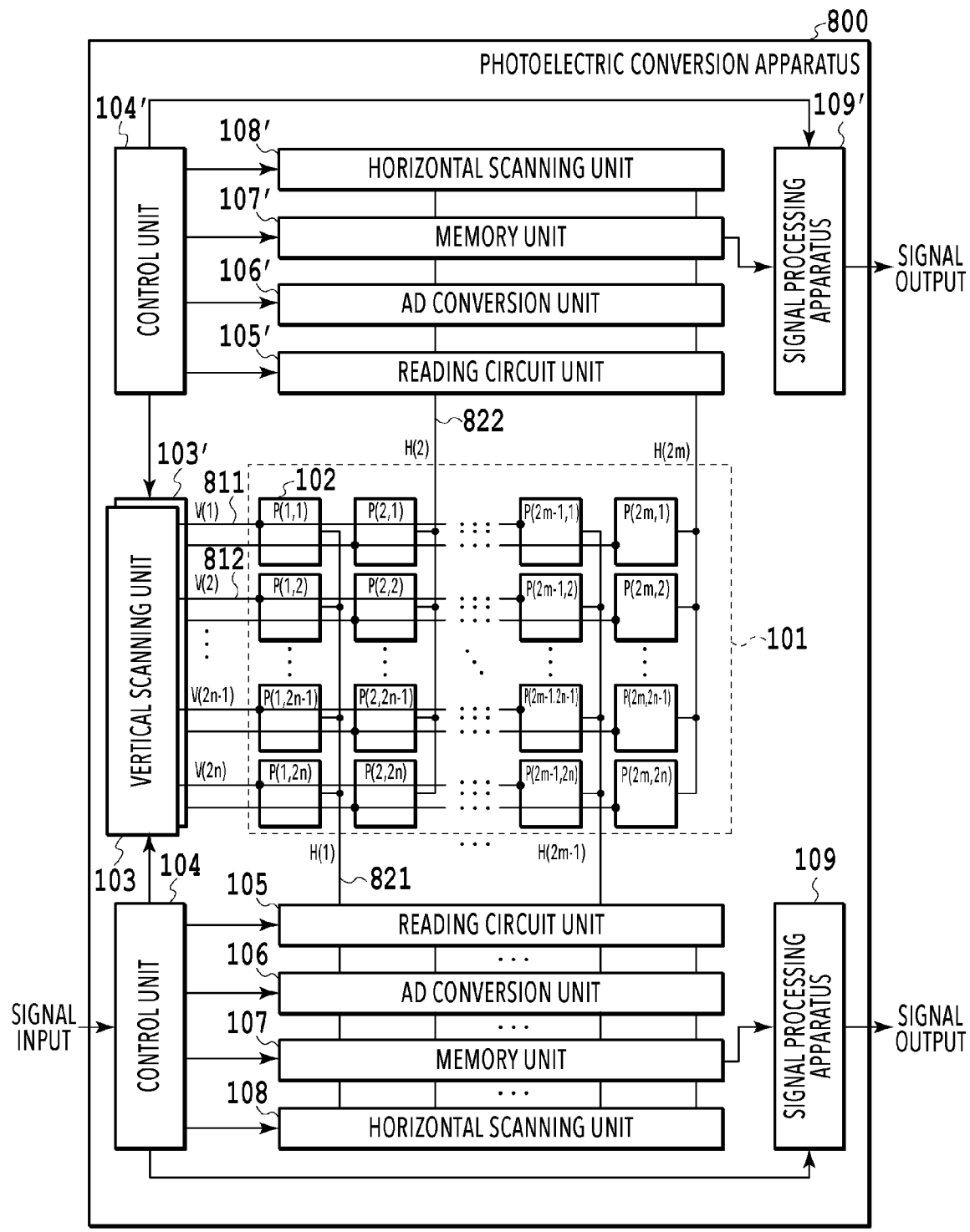
FIG. 8 is a diagram showing a configuration example of a photoelectric conversion apparatus comprising a signal processing apparatus.

FIG. 8 is a diagram showing a configuration example of a photoelectric conversion apparatus 800 according to the present embodiment. As shown in FIG. 8, the photoelectric conversion apparatus 800 further has a vertical scanning unit 103', a control unit 104', a reading circuit unit 105', an AD conversion unit 106', a memory unit 107', a horizontal scanning unit 108', and a signal processing apparatus 109', in addition to those of the photoelectric conversion apparatus 100 shown in FIG. 1. That is, the photoelectric conversion apparatus 800 has the two vertical scanning units, the two control units, the two reading circuit units, the two AD conversion units, the two memory units, the two horizontal scanning units, and the two signal processing apparatuses, respectively. In FIG. 8, each function unit and each device or apparatus of the photoelectric conversion apparatus 800 are arranged as follows. That is, the photoelectric conversion unit 101 and the vertical scanning units 103 and 103' are arranged in the center. The control unit 104, the reading circuit unit 105, the AD conversion unit 106, the memory unit 107, the horizontal scanning unit 108, and the signal processing apparatus 109 are arranged on the lower side of the photoelectric conversion unit 101 and the vertical scanning units 103 and 103'. The control unit 104', the reading circuit unit 105', the AD conversion unit 106', the memory unit 107', the horizontal scanning unit 108', and the signal processing apparatus 109' are arranged on the upper side of the photoelectric conversion unit 101 and the vertical scanning units 103 and 103'.

The control unit 104' obtains setting information, such as an image capturing condition at the time of image capturing of the photoelectric conversion apparatus 800, from a signal that is input directly from the outside or a signal that is sent from the control unit 104 and supplies a control signal in accordance with a condition of each configuration included in the photoelectric conversion apparatus 800.

It may also be possible to output signals that are output from the signal processing apparatus 109 and the signal processing apparatus 109' from ports corresponding thereto, respectively, or from one port.

Image data obtained in a pixel belonging to an odd-numbered column among each pixel 102 of the photoelectric conversion apparatus 101 is output by using a path 821 arranged on the lower side. Image data obtained in a pixel belonging to an even-numbered column among each pixel 102 of the photoelectric conversion apparatus 101 is output by using a path 822 arranged on the upper side. That is, in the present embodiment, a configuration example in a case of having two channels is shown and is an example in a case where the signal processing apparatuses 109 and 109' are arranged for each channel. The arrangement of each function unit and each device or apparatus of the photoelectric conversion apparatus 800 is not limited to the above-described arrangement.

By designing the configuration such as this, it is made possible to perform determination of OB floating for each channel. Further, by taking into consideration that each channel has each unique FPN component, the second threshold value that is used for determination of OB floating is set for each channel. In the present embodiment, by designing the photoelectric conversion apparatus having each function unit and each device or apparatus unit for each channel as described above, the determination processing of OB floating data shown in the first embodiment is performed.

As explained above, according to the present embodiment, even in a case where the FPN component unique to each channel occurs, it is possible to appropriately reduce the FPN component and the shading component by preventing black sink resulting from OB floating by OB clamp processing. Due to this, more preferred OB clamp processing is enabled.

Further, in the present embodiment, although the photoelectric conversion apparatus 800 having the signal processing apparatuses 109 and 109' for each channel is explained, the configuration of the photoelectric conversion apparatus 800 is not limited to this. For example, it may also be possible to design a photoelectric conversion apparatus having a signal processing apparatus in which the clamp value generation unit 500 and the second determination unit 502 are provided for each channel and what is required is to be capable of performing determination of OB floating for each channel.

Third Embodiment

A signal processing apparatus according to the present embodiment is explained with reference to a diagram. The same symbol is attached to the same component as that of the signal processing apparatus of the first and second embodiments and explanation thereof is omitted or simplified.

In the present embodiment, an aspect is explained in which it is possible to generate a more appropriate clamp value by taking into consideration also a case where the shading component in the vertical direction has occurred as well as OB floating.

Figure 9:
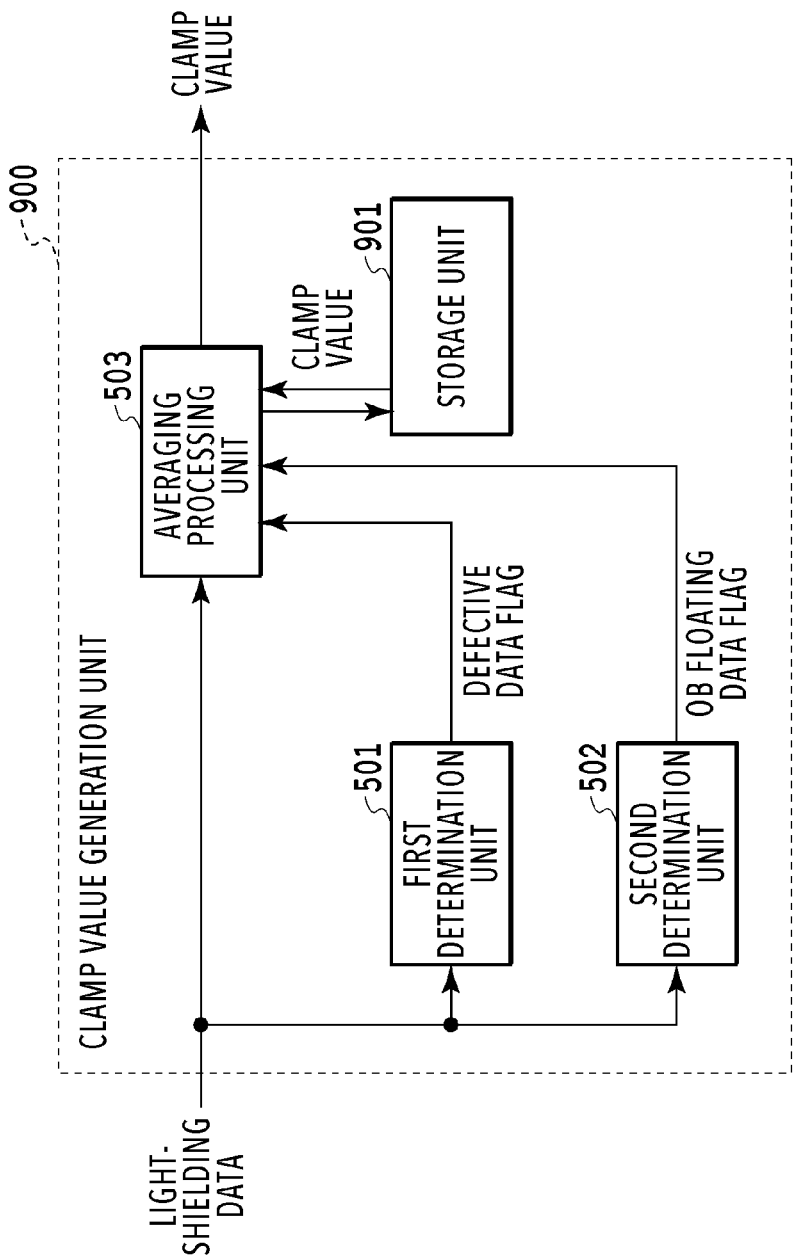
FIG. 9 is a block diagram showing a configuration example of a clamp value generation unit.

FIG. 9 is a block diagram showing a configuration example of a clamp value generation unit of the signal processing apparatus according to the present embodiment. As shown in FIG. 9, a clamp value generation unit 900 has a storage unit 901, in addition to the elements 501, 502, and 503 of the clamp value generation unit 500. The storage unit 901 connects with the averaging processing unit 503 so as to be capable of transmitting a clamp value. The storage unit 901 is, for example, a line memory, and stores in advance a clamp value of each row in which OB floating has not occurred, which is, for example, image data or the like of a pixel value not exceeding the first threshold value. It may also be possible to set in advance the clamp value stored in the storage unit 901 in accordance with an image capturing condition at the time of shipping for example. In the present embodiment, although the aspect of the signal processing apparatus having the clamp value generation unit 900 on which the storage unit 901 is mounted is explained, the mounting position of the storage unit 901 is not limited to this and for example, it may also be possible to mount the storage unit 901 in a photoelectric conversion apparatus or the like separate from the signal processing apparatus.

In the present embodiment, in a case where it is determined that OB floating has occurred in the target row (in a case of receiving OB floating flag=1) as a result of the determination by the flowchart in FIG. 6, the clamp value received by the averaging processing unit 503 from the storage unit 901 is taken as the output of the clamp value generation unit 900. That is, in the row for which it is determined that OB floating has occurred, OB clamp processing is performed by using the clamp value stored in advance in the storage unit 901.

As explained above, according to the present embodiment, it is also possible to reduce the shading component in the vertical direction as well as appropriately reducing the FPN component by preventing black sink resulting from OB floating by OB clamp processing. Due to this, more preferred OB clamp processing is enabled.

Fourth Embodiment

A signal processing apparatus according to the present embodiment is explained with reference to a diagram. The same symbol is attached to the same component as that of the signal processing apparatus of the first to third embodiments and explanation thereof is omitted or simplified.

In the present embodiment, an aspect is explained in which a more appropriate clamp value is generated by taking into consideration not only the last data determined to be OB floating but also all the OB floating data.

Figure 10:
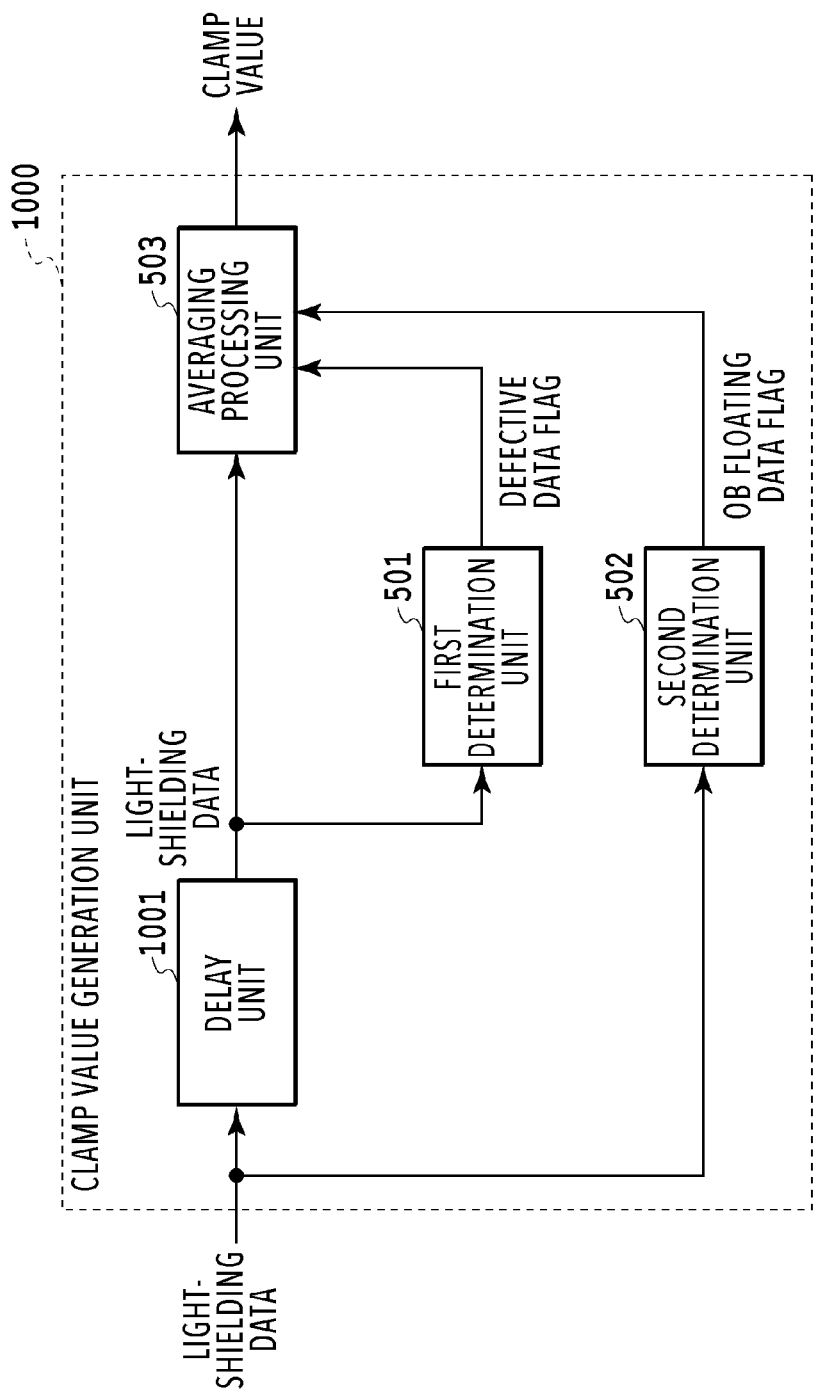
FIG. 10 is a block diagram showing a configuration example of a clamp value generation unit.

FIG. 10 is a block diagram showing a configuration example of a clamp value generation unit of the signal processing apparatus according to the present embodiment. As shown in FIG. 10, a clamp value generation unit 1000 has a delay unit 1001, in addition to the elements 501, 502, and 503 of the clamp value generation unit 500.

The delay unit 1001 is arranged on the transfer path of light-shielding data that is input to the clamp value generation unit 1000 and on the transfer path to the first determination unit 501 and the averaging processing unit 503, not on the transfer path to the second determination unit 502. The delay unit 1001 is, for example, a delay buffer for delaying processing corresponding to the number of comparisons for the second determination unit 502 to determine OB floating and outputs input data to the first determination unit 501 and the averaging processing unit 503 after delaying the data by a predetermined time. Due to this, it is possible for the averaging processing unit 503 to receive the OB floating flag, the defective data flag, and the light-shielding data at appropriate timing. As the predetermined time, it may also be possible to set the same time to the first determination unit 501 and the averaging processing unit 503, which are output destinations, or it may also be possible to set a different time to the first determination unit 501 and the averaging processing unit 503, respectively.

In the present embodiment, in a case where it is determined that OB floating has occurred in the target data as a result of the determination by the flowchart in FIG. 6, the averaging processing unit 503 uses the clamp value stored in the averaging processing unit 503 itself for filter processing, not the input light-shielding data. In the present embodiment, by the delay unit 1001 delaying the processing of the first determination unit 501 and the averaging processing unit 503 by the processing time consumed by the second determination unit 502, it is made possible to complement all the OB floating data.

As explained above, according to the present embodiment, it is possible to prevent black sink resulting from OB floating by OB clamp processing and further increase the average modulus, and therefore, it is possible to appropriately reduce the FPN component and the shading component. Due to this, preferred OB clamp processing is enabled.

Fifth Embodiment

Figure 11:
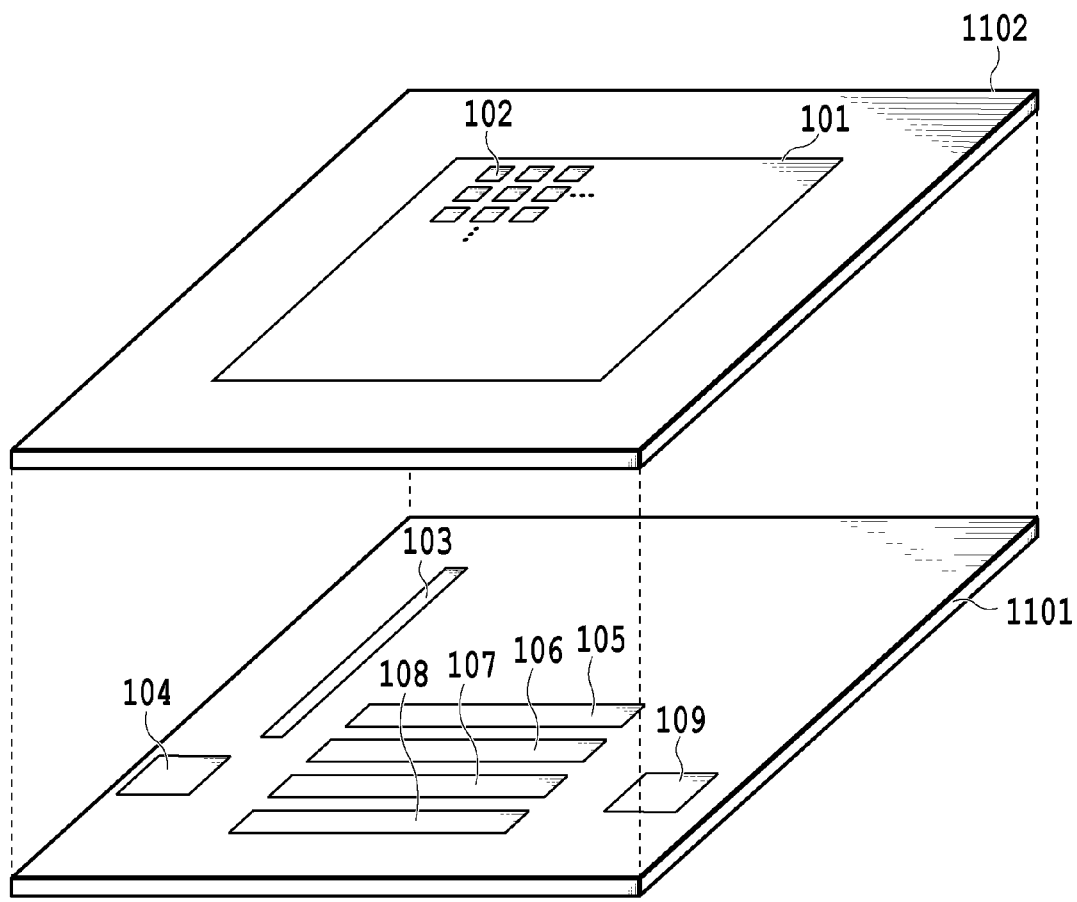
FIG. 11 is a diagram showing an arrangement example of a photoelectric conversion apparatus.

A photoelectric conversion apparatus according to the present embodiment is explained with reference to a diagram. FIG. 11 is a schematic diagram showing a configuration example of the photoelectric conversion apparatus according to the present embodiment. As shown in FIG. 11, it is possible to make up the photoelectric conversion apparatus according to the present embodiment by separately making each element shown in FIG. 1 on two semiconductor substrates 1101 and 1102 and joining these semiconductor substrates 1101 and 1102. It is possible to electrically connect the semiconductor substrate 1101 and the semiconductor substrate 1102 to each other via an electrically conductive member, for example, such as a bump electrode, and a through electrode. The semiconductor substrates 1101 and 1102 are substrates using a semiconductor, such as silicon.

On the semiconductor substrate 1102 on the upper side, among the elements shown in FIG. 1, only the photoelectric conversion unit 101 including the plurality of the pixels 102 is arranged. That is, on the substrate 1102 on the upper side, the photoelectric conversion unit 101 in which the pixels 102 comprising the light-receiving area 202 and the light-shielding area 201 are arranged in the form of an array is arranged. On the semiconductor substrate 1101 on the lower side, among the elements shown in FIG. 1, the elements other than the photoelectric conversion unit 101 are arranged. That is, on the semiconductor substrate 1101 on the lower side, each element, such as the vertical scanning unit 103, the control unit 104, the reading circuit unit 105, the AD conversion unit 106, the memory unit 107, the horizontal scanning unit 108, and the signal processing apparatus 109, is arranged.

Further, as shown in FIG. 11, at least part of the substrate 1101 and that of the substrate 1102 may be laminated. By making up the photoelectric conversion apparatus 100 in this manner, it is made possible to select the manufacturing process by the analog portion including the photoelectric conversion unit 101 and the logic portion including the signal processing apparatus 109, respectively, and therefore, it is made possible to obtain each favorable characteristic. As a result of that, according to the photoelectric conversion apparatus of the present embodiment, it is possible to obtain image data (captured data) whose image quality is improved.

Sixth Embodiment

Figure 12:
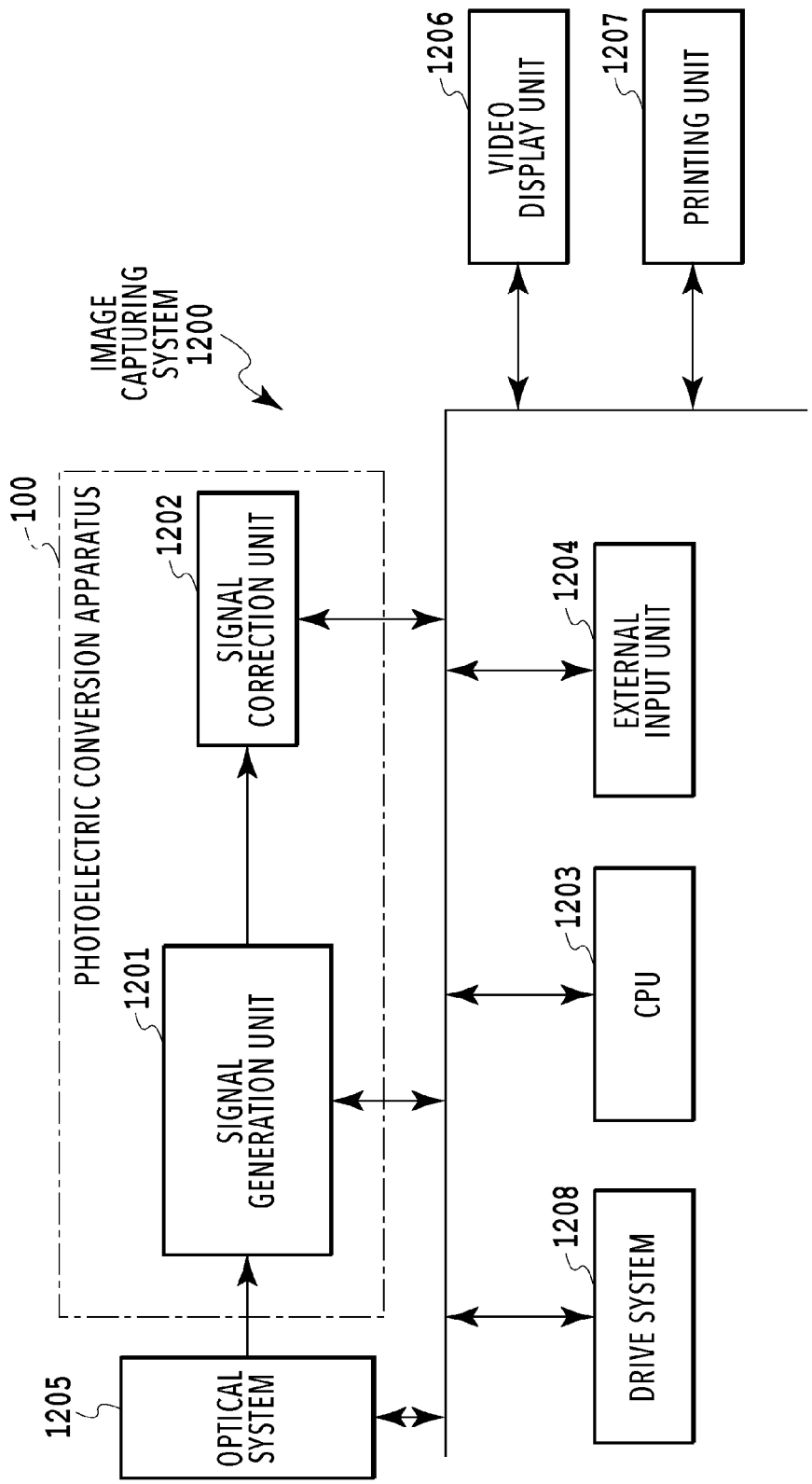
FIG. 12 is a diagram showing an outline configuration example of an image capturing system.

An image capturing system according to the present embodiment is explained by using a diagram. FIG. 12 is a diagram showing an outline configuration example of the image capturing system according to the present embodiment.

It is possible to apply the photoelectric conversion apparatus 100 explained in the above to various image capturing systems. As image capturing systems to which the photoelectric conversion apparatus 100 can be applied, mention is made of, for example, a digital still camera, a digital camcorder, a monitoring camera, a copy machine, a facsimile device, a mobile phone, an on-board camera, an observation satellite and the like. Further, a camera module comprising an optical system, such as a lens, and an image capturing apparatus is also included in the image capturing system. FIG. 12 shows a block diagram of a digital still camera as one example of these units.

As shown in FIG. 12, an image capturing system 1200 has the photoelectric conversion apparatus 100, a CPU 1203, an external input unit 1204, an optical system 1205, a video display area 1206, a printing unit 1207, and a drive system 1208. The photoelectric conversion apparatus 100 includes a signal generation unit 1201 and a signal correction unit 1202.

The signal generation unit 1201 includes the photoelectric conversion unit 101 including the above-described pixels 102, the vertical scanning unit 103, the control unit 104, the reading circuit unit 105, the AD conversion unit 106, the memory unit 107, and the horizontal scanning unit 108. The signal correction unit 1202 includes the above-described signal processing apparatus 109. Consequently, the configuration including the signal generation unit 1201 and the signal correction unit 1202 corresponds to the above-described photoelectric conversion apparatus 100. In the image capturing system 1200 having the configuration such as this, the signal generation unit 1201 alone can also be called a photoelectric conversion apparatus. That is, as described above, it may also be possible to arrange the signal processing apparatus 109 separately from the photoelectric conversion apparatus.

The signal generation unit 1201 generates an analog image signal by performing photoelectric conversion in accordance with light incident to the photoelectric conversion unit 101 of the signal generation unit 1201 by the optical system 1205 and outputs image data by AD converting the image signal.

The signal correction unit 1202 performs predetermined processing for the image signal that is output from the pixel 102 of the photoelectric conversion apparatus 100. The signal correction unit 1202 performs, for example, various kinds of correction processing and compression processing for the image signal and outputs the processed image signal. It is possible to display the image signal processed by the signal correction unit 1202 on the video display area 1206 or print the image signal in the printing unit 1207. The video display area 1206 is, for example, a liquid crystal monitor or the like, which displays an image, and may be in charge of part of functions of the external input unit 1204 by arranging a touch panel that receives a user operation. The printing unit 1207 may be incorporated in the image capturing system 1200 and may be attached to the image capturing system 1200 detachably like a printing medium.

The CPU 1203 governs the entire image capturing system 1200. The external input unit 1204 is various buttons with which for a user to perform input and an operation and receives information that is input from the outside, such as information relating to an operation performed by a user for the image capturing system 1200. As the input and operation by a user, mention is made of, for example, input of information relating to an image capturing condition and the like, pressing down of a shutter button, and the like. The drive system 1208 drives, for example, a lens and an aperture (none of them is shown schematically) configuring the optical system 1205. It may also be possible for the image capturing system 1200 to further include a memory unit for temporarily storing image data, an external interface for communicating with an external computer and the like.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

In the above, although the aspect is explained in which the clamp value (reference data) indicating the reference of black as a specific color is output, it is also possible to apply the present embodiment to an aspect in which reference data indicating a reference of white as a specific color is output. In this case, the pixel value of white is 255 for 8-bit image data, and therefore, the pixel value of the first threshold value is larger than the pixel value of the second threshold value. The pixel value of black is 0.

In the above, although explanation is given by taking the clamp value as an example, which is data indicating the black level in a case where image data that is output from the light-receiving pixel is processed, as reference data, the explanation is not limited to this. As the reference data, for example, it is possible to apply data indicating the white level in a case where image data that is output from the light-receiving pixel is processed.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

According to the present embodiment, it is possible to suppress deterioration of image quality in a case where OB floating occurs.

This application claims the benefit of Japanese Patent Application No. 2021-071117, filed Apr. 20, 2021, which is hereby incorporated by reference wherein in its entirety.

What is claimed is:

1. A signal processing apparatus that processes image data from a solid-state image sensing element having a plurality of light-receiving pixels arranged in a light-receiving area and a plurality of light-shielded pixels arranged in a light-shielding area, the signal processing apparatus comprising:
   a first determination unit configured to specify portions at which a predetermined number of pixel values exceeding a first threshold value are continuous as floating data of continuous image data indicated by pixel values output from a plurality of continuous light-shielded pixels;
   a second determination unit configured to specify image data having a pixel value exceeding a second threshold value as defective data of the continuous image data; and
   an output unit configured to output reference data indicating a reference of a specific color obtained by using a rest of image data, which is the continuous image data from which the floating data specified by the first determination unit is removed, and alternative image data having pixel values not exceeding the first threshold value, which is used in place of the floating data specified by the first determination unit, wherein
   the pixel value of the first threshold value is smaller than the pixel value of the second threshold value in a case where the specific color is black, and
   the pixel value of the first threshold value is larger than the pixel value of the second threshold value in a case where the specific color is white.

2. The signal processing apparatus according to claim 1, wherein
   the output unit outputs the reference data obtained by performing integral averaging of the rest of image data from which the floating data is removed and the alternative image data.

3. The signal processing apparatus according to claim 1, wherein
   the alternative image data is image data stored in advance, reference data output from a previous target by the output unit, or image data having the first threshold value.

4. The signal processing apparatus according to claim 1, comprising:
   a storage unit configured to store the alternative image data.

5. The signal processing apparatus according to claim 1, wherein
   the output unit does not use the defective data specified by the second determination unit in output of the reference data.

6. The signal processing apparatus according to claim 1, further comprising:
   a delay unit configured to delay input of the image data to the output unit.

7. The signal processing apparatus according to claim 6, wherein
   the delay unit delays input of the image data continuous across the predetermined number to the output unit so that timing is the same as that of input of the floating data specified by the first determination unit to the output unit.

8. The signal processing apparatus according to claim 5, further comprising:
   a delay unit configured to delay input of the image data to the output unit.

9. The signal processing apparatus according to claim 8, wherein
   the delay unit delays input of the image data continuous across the predetermined number to the output unit so that timing is the same as that of input of the floating data specified by the first determination unit to the output unit.

10. The signal processing apparatus according to claim 8, wherein
    the delay unit delays input of the defective data specified by the second determination unit to the output unit so that timing is the same at that of input of the floating data specified by the first determination unit to the output unit.

11. The signal processing apparatus according to claim 1, wherein
    the reference data is data indicating a black level in case where image data that is output from the light-receiving pixel is processed.

12. The signal processing apparatus according to claim 1, wherein
    the first determination unit specifies the floating data for each horizontal line of the plurality of light-shielded pixels and
    the output unit outputs the reference data for each horizontal line of the plurality of light-shielded pixels.

13. The signal processing apparatus according to claim 1, wherein
    the first determination unit specifies the floating data for each vertical line of the plurality of light-shielded pixels and
    the output unit outputs the reference data for each vertical line of the plurality of light-shielded pixels.

14. A photoelectric conversion apparatus comprising:
    the signal processing apparatus according to claim 1; and a photoelectric conversion unit having the light-receiving pixel and the light-shielded pixel and outputting the image data that is processed by the signal processing apparatus.

15. The photoelectric conversion apparatus according to claim 14, comprising:
a first substrate on which the signal processing apparatus is arranged and a second substrate on which the photoelectric conversion unit is arranged.

16. The photoelectric conversion apparatus according to claim 15, wherein
at least part of the first substrate and that of the second substrate are laminated.

17. An image capturing system comprising:
the signal processing apparatus according to claim 1; and
a photoelectric conversion unit having the light-receiving pixel and the light-shielded pixel and outputting the image data that is processed by the signal processing apparatus.

18. A control method of a signal processing apparatus that processes image data from a solid-state image sensing element having a plurality of light-receiving pixels arranged in a light-receiving area and a plurality of light-shielded pixels arranged in a light-shielding area, the control method comprising:

a first determination step of specifying portions at which a predetermined number of pixel values exceeding a first threshold value are continuous as floating data of continuous image data indicated by pixel values output from a plurality of continuous light-shielded pixels;
a second determination unit configured to specify image data having a pixel value exceeding a second threshold value as defective data of the continuous image data; and
an output step of outputting reference data indicating a reference of a specific color obtained by using a rest of image data, which is the continuous image data from which the floating data specified at the first determination step is removed, and alternative image data having pixel values not exceeding the first threshold value, which is used in place of the floating data specified at the first determination step, wherein
the pixel value of the first threshold value is smaller than the pixel value of the second threshold value in a case where the specific color is black, and
the pixel value of the first threshold value is larger than the pixel value of the second threshold value in a case where the specific color is white.

* * * * *